US012653024B2

(12) United States Patent
Chou et al.

(10) Patent No.: US 12,653,024 B2
(45) Date of Patent: Jun. 9, 2026

(54) SEMICONDUCTOR DEVICE AND METHOD FORMING THE SAME

(71) Applicant: Winbond Electronics Corp., Taichung City (TW)

(72) Inventors: Hsin-Hung Chou, Taichung City (TW); Kao-Tsair Tsai, Taichung City (TW)

(73) Assignee: WINBOND ELECTRONICS CORP., Taichung City (TW)

( * ) Notice: Subject to any disclaimer, the term of this patent is extended or adjusted under 35 U.S.C. 154(b) by 732 days.

(21) Appl. No.: 17/716,771

(22) Filed: Apr. 8, 2022

(65) Prior Publication Data

US 2022/0415783 A1 Dec. 29, 2022

(30) Foreign Application Priority Data

Jun. 25, 2021 (TW) ................................. 110123327

(51) Int. Cl.
| | |
|---|---|
| *H10W 20/43* | (2026.01) |
| *H10P 50/00* | (2026.01) |
| *H10P 50/26* | (2026.01) |
| *H10W 20/00* | (2026.01) |

(52) U.S. Cl.
CPC ........... *H10W 20/43* (2026.01); *H10P 50/264* (2026.01); *H10P 50/71* (2026.01); *H10W 20/067* (2026.01)

(58) Field of Classification Search
CPC ........ H10B 41/35; H10B 41/50; H10B 41/10; H01L 21/32139; H10W 20/43; H10W 20/067
See application file for complete search history.

(56) References Cited

U.S. PATENT DOCUMENTS

| | | | | |
|---|---|---|---|---|
| 2009/0311634 A1* | 12/2009 | Yue | ..................... | H01L 21/0338 430/323 |
| 2010/0173492 A1* | 7/2010 | Kim | ..................... | H10P 50/695 438/689 |
| 2014/0252444 A1* | 9/2014 | You | ..................... | H10B 41/10 257/315 |

FOREIGN PATENT DOCUMENTS

TW           I703619 B      9/2020

* cited by examiner

*Primary Examiner* — Shih Tsun A Chou
(74) *Attorney, Agent, or Firm* — MUNCY, GEISSLER, OLDS & LOWE, P.C.

(57) ABSTRACT

A method includes: forming a patterned dielectric layer, including a predetermined word line region and a predetermined pick-up neck region being separated by a first distance, and the patterned dielectric layer within the predetermined pick-up neck region has a second distance, wherein the first distance is smaller than or equal to the second distance; forming a spacer on sidewalls of the patterned dielectric layer; cutting off the spacer of a connecting portion of the predetermined word line region from the spacer of a remaining portion of the predetermined word line region; forming a mask pattern, including a first portion across the connecting portion and the predetermined pick-up neck region, wherein the spacer at the remaining portion is spaced apart from the first portion; and forming a dummy structure, word lines, and pick-up necks, wherein the dummy structure is located between the word lines and the pick-up necks.

12 Claims, 9 Drawing Sheets

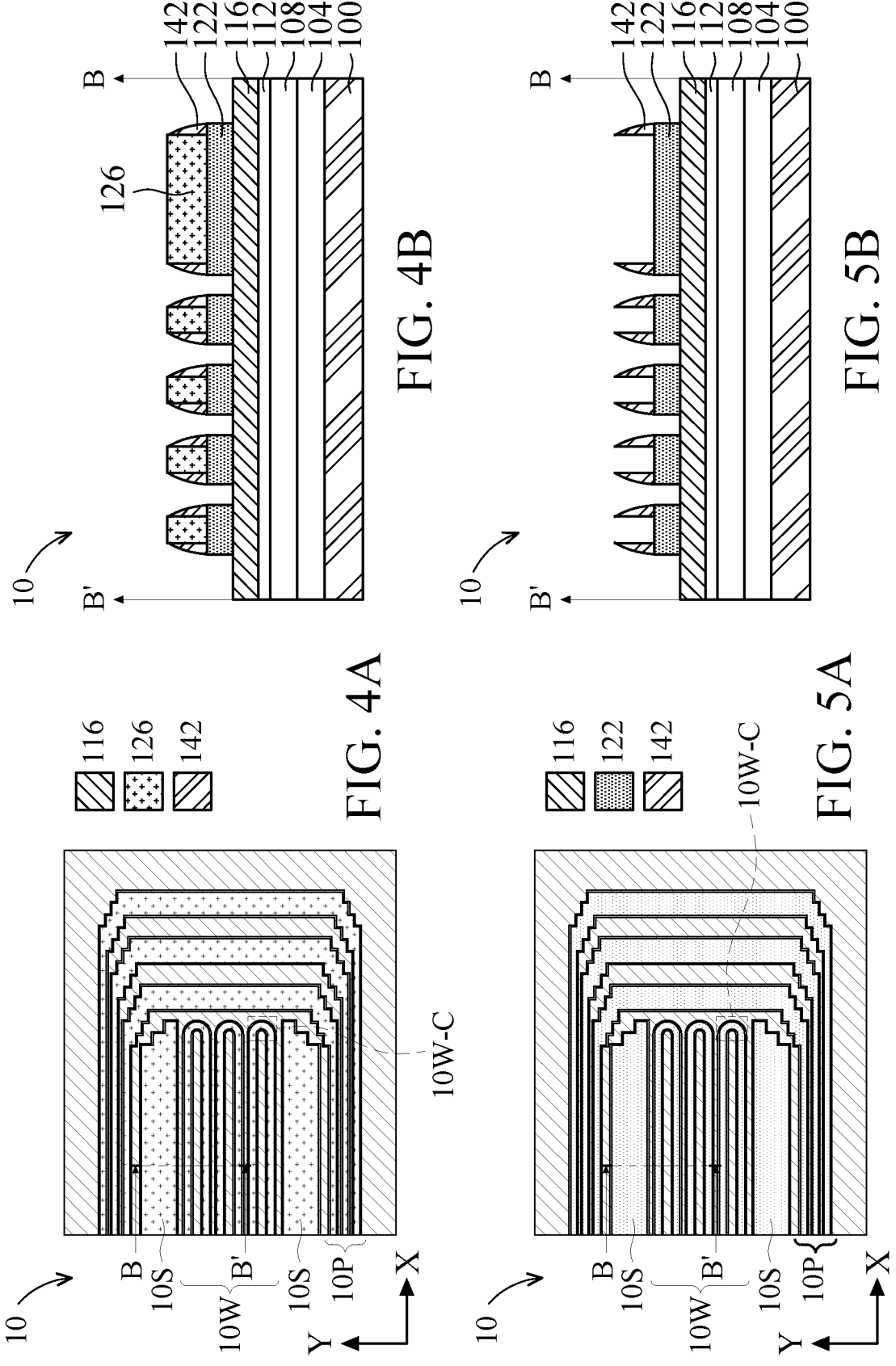

SEMICONDUCTOR DEVICE AND METHOD FORMING THE SAME

CROSS REFERENCE TO RELATED APPLICATIONS

This application claims priority of Taiwan Patent Application No. 110123327 filed on Jun. 25, 2021, the entirety of which is incorporated by reference herein.

BACKGROUND

Technical Field

The present disclosure relates to a semiconductor device and method of forming the same, and in particular it relates to a flash memory and method of forming the same.

Description of the Related Art

In the semiconductor manufacturing process, various features are patterned through lithography and etching processes. When feature sizes are continuously reduced, there are still many issues for manufacturing a flash memory, which needs to be improved in order to achieve the goals of elevating the process window and lowering the manufacturing cost.

SUMMARY

In an embodiment, a method for forming a semiconductor device, comprising: providing a substrate, forming a conductive layer on the substrate, and forming a patterned dielectric layer on the conductive layer. The patterned dielectric layer comprises: a predetermined word line region, a pair of predetermined select gate regions, and a predetermined pick-up neck region. The predetermined word line region is disposed between the pair of predetermined select gate regions. The predetermined pick-up neck region surrounds the pair of predetermined select gate regions. The predetermined word line region and the predetermined pick-up neck region are laterally separated by a first distance, and the patterned dielectric layer within the predetermined pick-up neck region has a second distance, wherein the first distance is smaller than or equal to the second distance. The method also comprises forming a spacer on sidewalls of the patterned dielectric layer, and removing the patterned dielectric layer after forming the spacer; cutting off the spacer of a connecting portion of the predetermined word line region from the spacer of a remaining portion of the predetermined word line region; and forming a mask pattern on the spacer, wherein the mask pattern comprises a first portion. The first portion laterally spans across the spacer of the connecting portion and the spacer of a portion of the predetermined pick-up neck region, wherein the spacer of the remaining portion of the predetermined word line region and the first portion of the mask pattern laterally are separated by a spacing. The method also comprises performing an etching process on the conductive layer to form a dummy structure, a plurality of word lines, a pair of select gates, and a plurality of pick-up neck pairs using the mask pattern and the spacer as etching masks, wherein the dummy structure is laterally located between the plurality of word lines and the plurality of pick-up neck pairs.

In another embodiment, a semiconductor device, comprising: a plurality of word lines, a pair of select gates, a plurality of pick-up neck pairs, and a dummy structure. The plurality of word lines are located between the pair of select gates. The plurality of pick-up neck pairs surround the pair of select gates. The dummy structure is laterally located between the plurality of word lines and the plurality of pick-up neck pairs. The dummy structure and the plurality of word lines are laterally separated by a spacing.

BRIEF DESCRIPTION OF THE DRAWINGS

The disclosure can be more fully understood from the following detailed description when read with the accompanying figures. It is worth noting that, in accordance with standard practice in the industry, various features are not drawn to scale. In fact, the dimensions of the various features may be arbitrarily increased or reduced for clarity of discussion.

FIGS. 1A-9A and 10-17 illustrate top views of various intermediate stages of forming a flash memory, according to some embodiments of the present disclosure.

FIGS. 1B-9B and 6C-9C illustrate cross-sectional views of the various intermediate stages of forming the flash memory, according to some embodiments of the present disclosure.

DETAILED DESCRIPTION

Figures 1A, 1B:
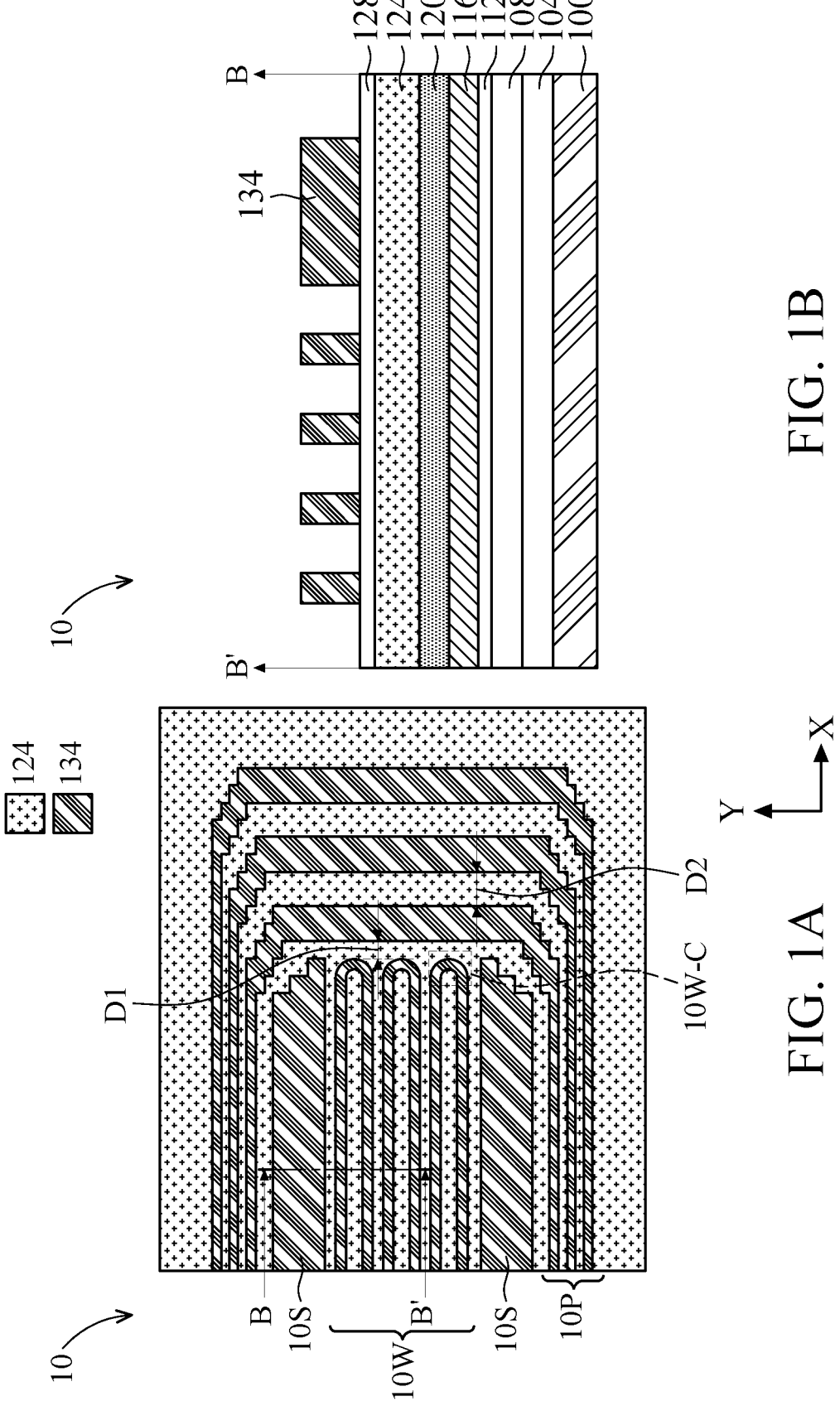

FIGS. 1A, 1B, 2A, 2B, 3A, 3B, 4A, 4B, 5A, 5B, 6A-6C, 7A-7C, 8A-8C, and 9A-9C illustrate top views and corresponding cross-sectional views of various intermediate stages of forming a flash memory 10, according to some embodiments of the present disclosure. In the present embodiment, the flash memory 10 is a NAND-type ("not and") flash memory. As shown in FIG. 9A, the flash memory 10 includes: a plurality of word lines 210, a pair of select gates 220 vertically (for example in the direction of the y-axis) sandwiching the plurality of word lines 210 from two sides, a plurality of pick-up neck pairs 230 surrounding the pair of select gates 220, and a dummy structure 200 laterally located between the plurality of word lines 210 and the plurality of pick-up neck pairs 230.

The dummy structure 200 may occupy an isolated circuit region in order to effectively decrease the etch loading effect at the end points of the plurality of word lines 210, and to prevent the occurrence of bowling or even fracture. The dummy structure 200 and the plurality of word lines 210 laterally have a spacing S, wherein the spacing S may be between about 10 nm and 150 nm. If the spacing S is larger than 150 nm, then the isolated circuit region may still cause the etch loading effect at the end points of the plurality of word lines 210, leading to the occurrence of bowling or even fracture. On the other hand, if the spacing S is smaller than 10 nm, then the process margin would be difficult to control, and resulted in the dummy structure 200 and the plurality of word lines 210 to physically contact to cause short circuitry. The dummy structure 200 is a non-continuous structure, and may be designed into various shapes. In a particular embodiment, the dummy structure 200 may include multiple bullet-shape structures, as shown in FIG. 9A.

According to some embodiments of the present disclosure, the manufacturing procedures of the flash memory 10 are described in detail. At first, please refer to FIGS. 1A and 1B, a conductive layer 108, a first dielectric layer 112, a second dielectric layer 116, a third dielectric layer 124, and other layers (described in detail below) used to form the flash memory 10 are sequentially formed on a substrate 100, only the third dielectric layer 124 is illustrated in FIG. 1A.

After that, a first mask pattern 134 may be formed on the third dielectric layer 124, the first mask pattern 134 includes a predetermined word line region 10W, a pair of predetermined select gate regions 10S, and a predetermined pick-up neck region 10P having multiple segments. In subsequent processes, a plurality of word lines 210, a pair of select gates 220, and a plurality of pick-up neck pairs 230 are to be formed in the predetermined word line region 10W, the pair of predetermined select gate regions 10S, and a predetermined pick-up neck region 10P, respectively. The dummy structure 200 in FIG. 9A will be formed from a pattern defined by a connecting portion 10W-C of the predetermined word line region 10W and a portion of the pair of predetermined select gate regions 10S. The connecting portion 10W-C includes multiple U-shaped structures, each of which connects two adjacent strip-shape structures in the predetermined word line region 10W.

Still referring to FIG. 1A, the predetermined word line region 10W is vertically (for example, in the direction of the y-axis) located between the pair of predetermined select gate regions 10S. The predetermined word line region 10W and the pair of predetermined select gate regions 10S both laterally (for example, in the direction of the x-axis) extend toward the predetermined pick-up neck region 10P, so the predetermined word line region 10W and the predetermined pick-up neck region 10P have a first distance D1 in the direction of the x-axis. Furthermore, the neighboring segments of the first mask pattern 134 within the predetermined pick-up neck region 10P have a second distance D2 in the direction of the x-axis. The first distance D1 is smaller than or equal to the second distance D2. The first distance D1 may be between about 20 nm and 300 nm, for example between about 100 nm and 200 nm, while the second distance D2 may be between about 100 nm and 300 nm, for example between about 140 nm and 200 nm. A photoresist layer may be formed on the third dielectric layer 124 by a lithography process, followed by performing an exposure process and a development process on the photoresist layer to complete the first mask pattern 134.

FIG. 1B is a cross-sectional view of the flash memory 10 shown in FIG. 1A, wherein the cross-sectional view is obtained from the vertical plane containing line B-B' in FIG. 1A. The subsequent cross-sectional views in subsequent figures whose figure numbers have the letter "B", unless specified otherwise, are also obtained from the same plane as the vertical plane containing line B-B' in the corresponding top views. Please refer to FIG. 1B, except for the layers previously mentioned, the flash memory 10 further includes a substrate 100, a first polymer layer 104 between the substrate 100 and the conductive layer 108, a second polymer layer 120 between the second dielectric layer 116 and the third dielectric layer 124, a first anti-reflective coating layer 128 on the third dielectric layer 124, and the first mask pattern 134. During the self-aligned double patterning (SADP) process, the second polymer layer 120 may function as an intermediate layer for the hard mask, and the second dielectric layer 116 can protect the underlying layers from intermediate etching processes.

Still referring to FIG. 1B, the first polymer layer 104 may be formed on the substrate 100. Materials of the first polymer layer 104 may include polyimide (PI), benzocyclobutene (BCB), polybenzoxazole (PBO), the like, or combinations thereof. The thickness of the first polymer layer 104 may be between about 40 nm and 120 nm, for example, between about 60 nm and 100 nm. The first polymer layer 104 can protect the substrate 100 from subsequent processes, and may function as a dielectric layer for other features.

Please refer to FIG. 1B, the conductive layer 108 may be formed on the first polymer layer 104. Materials of the conductive layer 108 may include amorphous silicon, polysilicon, poly-SiGe, metal nitride, metal silicide, metal oxide, and metals. Metals may include cobalt (Co), ruthenium (Ru), aluminum (Al), tungsten (W), copper (Cu), silver (Ag), gold (Au), nickel (Ni), the like, combinations thereof, or multiple layers thereof. The conductive layer 108 may be tungsten. The thickness of the conductive layer 108 may be between about 30 nm and 80 nm, for example, between about 40 nm and 70 nm.

Still referring to FIG. 1B, the first dielectric layer 112 may be formed on the conductive layer 108. In some embodiments, materials of the first dielectric layer 112 may include silicon oxide (SiO), silicon nitride (SiN), silicon carbide (SiC), silicon oxynitride (SiON), silicon oxynitrocarbide ($SiO_xN_yC_{1-x-y}$, wherein x and y are in the range from 0 to 1), tetraethylorthosilicate (TEOS), un-doped silicate glass, or doped silicate glass (such as boron-doped phospho-silicate glass (BPSG), fused silica glass (FSG), phosphosilicate glass (PSG), boron-doped silicate glass (BSG)), low-k dielectric materials, or other suitable dielectric materials. The first dielectric layer 112 may be silicon oxide. The thickness of the first dielectric layer 112 may be between about 30 nm and 70 nm, for example, between about 40 nm and 60 nm.

Please refer to FIG. 1B, the second dielectric layer 116 may be formed on the first dielectric layer 112. In some embodiments, the second dielectric layer 116 may include similar materials as the first dielectric layer 112. The thickness of the second dielectric layer 116 may be between about 130 nm and 220 nm, for example, between about 140 nm and 200 nm. In some embodiments, besides providing protection and insulation on the underlying layers, the second dielectric layer 116 can also reduce stress value generated between an upper layer and a lower layer that are in direct contact.

Still referring to FIG. 1B, the second polymer layer 120 may be formed on the second dielectric layer 116. The second polymer layer 120 may include similar materials as the first polymer layer 104. The thickness of the second polymer layer 120 may be between about 30 nm and 130 nm, for example, between about 60 nm and 100 nm. As stated above, the second polymer layer 120 may function as the intermediate layer of the hard mask. In other words, the final structure of the flash memory 10 will include all the layers below the second polymer layer 120.

Please refer to FIG. 1B, the third dielectric layer 124 may be formed on the second polymer layer 120. The third dielectric layer 124 may include similar materials as the first dielectric layer 112 and the second dielectric layer 116. The third dielectric layer 124 may be any suitable carbide materials. The thickness of the third dielectric layer 124 may be between about 80 nm and 170 nm, for example, between about 100 nm and 150 nm. In some embodiments, the third dielectric layer 124 may function as a mold for a spacer 142 subsequently formed.

Still referring to FIG. 1B, the lithography process may be performed to pattern the third dielectric layer 124. The first anti-reflective coating layer 128 and the photoresist layer are sequentially deposited on the third dielectric layer 124. The photoresist layer may be patterned using a photo-mask to form the first mask pattern 134. The first anti-reflective coating layer 128 may include oxynitride, such as silicon oxynitride. The thickness of the first anti-reflective coating layer 128 may be between about 5 nm and 40 nm, for example, between about 10 nm and 30 nm. The thickness of the first mask pattern 134 may be between about 70 nm and 140 nm, for example, between about 80 nm and 130 nm. The first anti-reflective coating layer 128 may effectively control the critical dimension (CD) of a patterned third dielectric layer 126 to be formed later.

Figures 2A, 2B, 3A, 3B:
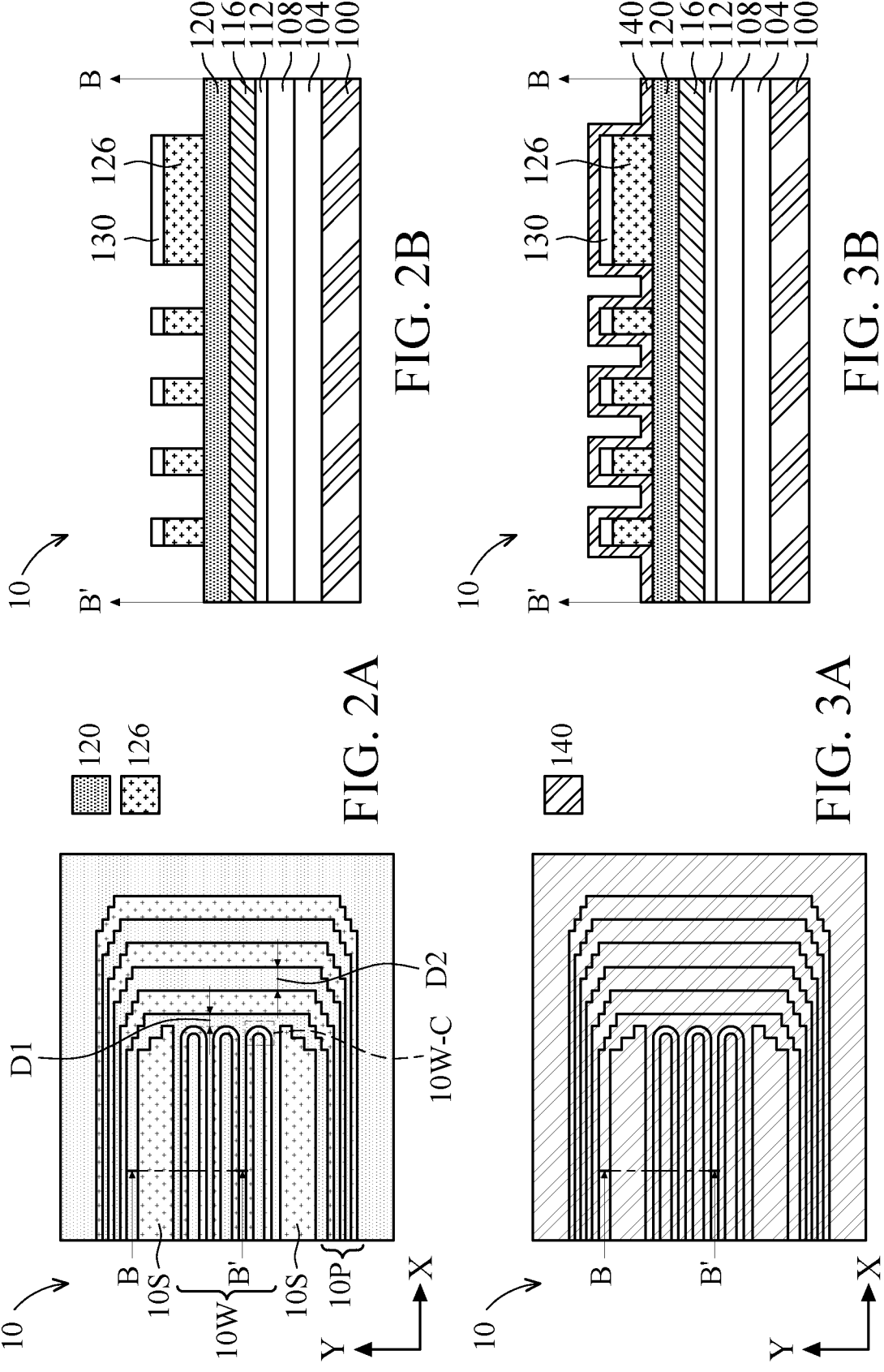

Please refer to FIGS. 2A and 2B, according to some embodiments of the present disclosure, the first anti-reflective coating layer 128 and the third dielectric layer 124 are sequentially etched by an etching process (such as a dry etching process) using the first mask pattern 134 as etching mask. One or more cycles of the etching process may be performed until the shape of the first mask pattern 134 is completely transferred to the first anti-reflective coating layer 128 and the third dielectric layer 124. An etching selectivity of the first mask pattern 134 to the first anti-reflective coating layer 128 and the third dielectric layer 124 may be controlled between about 0.2 and 3.0. After the dry etching process, the third dielectric layer 124 and the first anti-reflective coating layer 128 are formed into the patterned third dielectric layer 126 and a patterned first anti-reflective coating layer 130, respectively.

Still referring to FIGS. 2A and 2B, according to some embodiments of the present disclosure, the patterned third dielectric layer 126 (and the patterned first anti-reflective coating layer 130) may correspond to the first mask pattern 134. Therefore, the patterned third dielectric layer 126 (and the patterned first anti-reflective coating layer 130) also includes the predetermined word line region 10W, the pair of predetermined select gate regions 10S, and the predetermined pick-up neck region 10P having multiple segments. The predetermined word line region 10W is vertically (for example, in the direction of the y-axis) located between the pair of predetermined select gate regions 10S. The predetermined word line region 10W and the pair of predetermined select gate regions 10S both laterally (for example, in the direction of the x-axis) extend toward the predetermined pick-up neck region 10P, so the predetermined word line region 10W and the predetermined pick-up neck region 10P have the first distance D1 in the direction of the x-axis. Furthermore, the neighboring segments of the patterned third dielectric layer 126 (and the patterned first anti-reflective coating layer 130) in the predetermined pick-up neck region 10P have the second distance D2 in the direction of the x-axis. The first distance D1 is smaller than or equal to the second distance D2. After patterning the third dielectric layer 124 and the first anti-reflective coating layer 128 respectively into the patterned third dielectric layer 126 and the patterned first anti-reflective coating layer 130, a portion of the top surface of the underlying second polymer layer 120 is thus exposed.

Please refer to FIGS. 3A and 3B, according to some embodiments of the present disclosure, a spacer material layer 140 is conformally deposited on the top surface and the sidewalls of the patterned third dielectric layer 126 and the patterned first anti-reflective coating layer 130, and on the exposed surface of the second polymer layer 120. The spacer material layer 140 is a continuous structure covering the entire surface of the flash memory 10. Materials of the spacer material layer 140 may include silicon oxide, silicon nitride, silicon oxynitride, silicon oxynitrocarbide (Si-$O_xN_yC_{1-x-y}$, wherein x and y are in the range from 0 to 1), the like, or combinations thereof. The thickness of the spacer material layer 140 may be between about 10 nm and 35 nm, for example, between 15 nm and 30 nm. In the embodiments where the spacer material layer 140 is formed of silicon oxynitrocarbide, the silicon oxynitrocarbide layer may be deposited using a dielectric precursor, which includes a silicon-source precursor and a nitrogen-source precursor.

Please refer to FIGS. 4A and 4B, according to some embodiments of the present disclosure, horizontal portions (including a portion on the patterned first anti-reflective coating layer 130 and a portion on the exposed surface of the second polymer layer 120) of the spacer material layer 140 may be etched. One or more cycles of an etching process may be performed until the horizontal portions of the spacer material layer 140, the patterned first anti-reflective coating layer 130, and a portion of the second polymer layer 120 covered by the spacer material layer 140 are completely removed. After the etching process, the top surface of the patterned third dielectric layer 126 and a portion of the top surface of the second dielectric layer 116 are exposed. A portion of the spacer material layer 140 remaining on sidewalls of the patterned third dielectric layer 126 becomes the spacer 142. The etching process etches (or indirectly patterns) the second polymer layer 120 to form a patterned second polymer layer 122 using the patterned third dielectric layer 126 and the spacer 142 as etching masks. Top portions of the patterned third dielectric layer 126 and the spacer 142 are levelled. The top portion of the spacer 142 may be higher than or lower than the top surface of the patterned third dielectric layer 126 (not shown).

Please refer to FIGS. 5A and 5B, according to some embodiments of the present disclosure, a suitable etching process is performed to remove the patterned third dielectric layer 126 between the spacer 142, in order to expose the patterned second polymer layer 122. After completing the etching process, a portion of the patterned second polymer layer 122 covered by the patterned third dielectric layer 126 is thus exposed, while a remaining portion of the patterned second polymer layer 122 is still covered by the spacer 142.

Figures 6A, 6B, 6C:
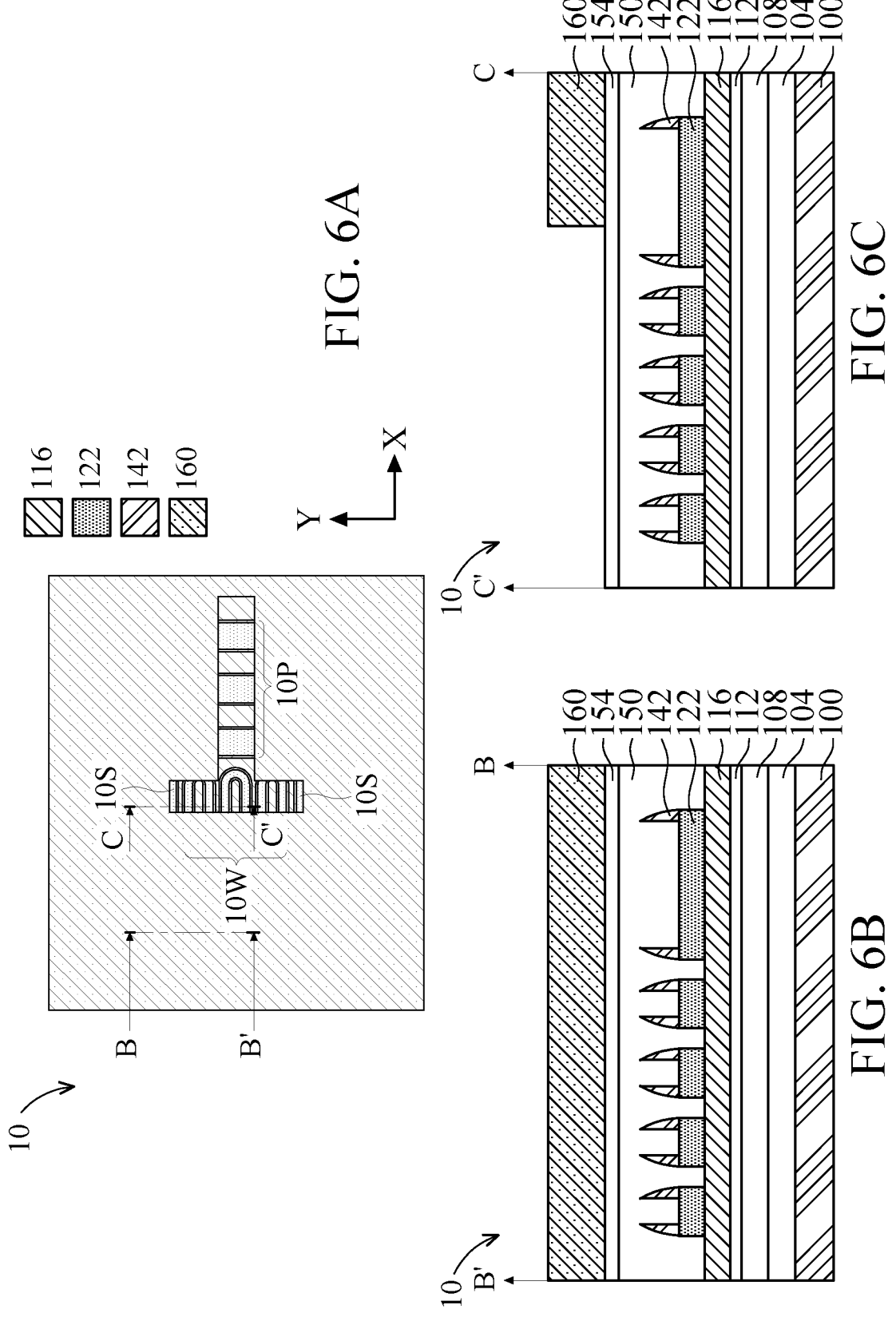

Please refer to FIGS. 6A, 6B, and 6C, in order for every word line 210 subsequently formed in the predetermined word line region 10W to become independent and normally operated gate structure, the spacer 142 on the connecting portion 10W-C of the predetermined word line region 10W must be cut off from the spacer 142 of the remaining portion of the predetermined word line region 10W. Furthermore, to prevent the plurality of pick-up neck pairs 230 subsequently formed in the predetermined pick-up neck region 10P from conducting and causing short circuitry, the spacer 142 of a portion of the predetermined pick-up neck region 10P also needs to be cut off. This procedure is known as a gate insulating cut (GI cut). As shown in FIG. 6A, a patterning is performed on the spacer 142 to form a second mask pattern 160 on the spacer 142.

FIG. 6C is a cross-sectional view of the flash memory 10 shown in FIG. 6A, wherein the cross-sectional view is obtained from the vertical plane containing line C-C' in FIG. 6A. The subsequent cross-sectional views in subsequent figures whose figure numbers have the letter "C", unless specified otherwise, are also obtained from the same plane as the vertical plane containing line C-C' in the corresponding top views. The formation of the second mask pattern 160 includes coating a first photoresist layer 150 on the surface of the flash memory 10. The first photoresist layer 150 completely covers the second dielectric layer 116, the patterned second polymer layer 122, and the spacer 142, and the first photoresist layer 150 has a planarized top surface. A second anti-reflective coating layer 154 may be formed on the first photoresist layer 150. The second mask pattern 160 may be formed on the second anti-reflective coating layer 154.

According to some embodiments, the second mask pattern 160 covers the entire surface of the flash memory 10, except an area where the spacer 142 needs to be cut off, such area is exposed through development. The exposed area includes one part spanning across a portion the predetermined word line region 10W in the direction of the y-axis and reaching a portion of the pair of predetermined select gate regions 10S, and another part spanning across a portion of the predetermined pick-up neck region 10P in the direction of the x-axis. The second mask pattern 160 and the first mask pattern 134 may have different types of materials.

Figures 7A, 7B, 7C:
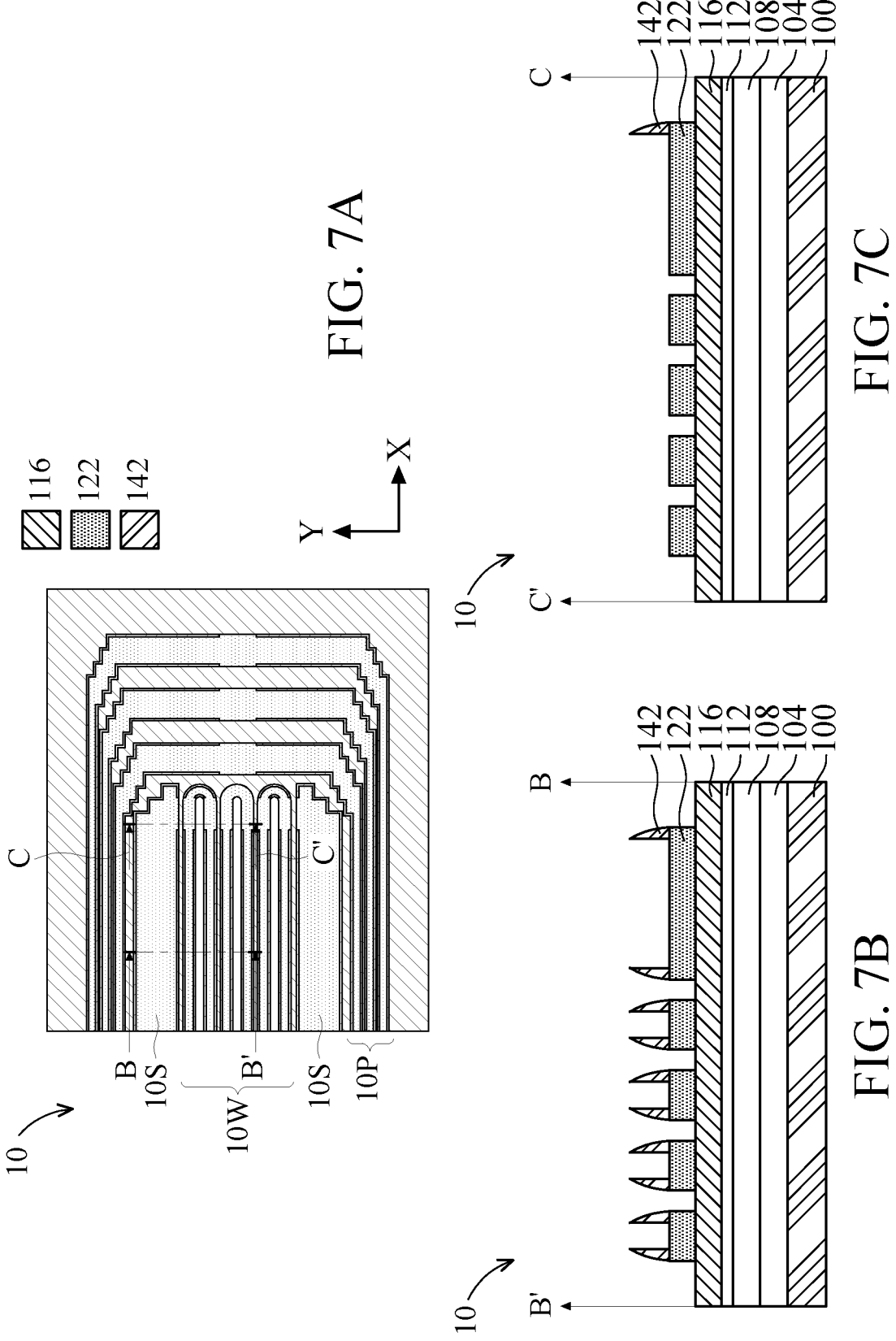

Please refer to FIGS. 7A, 7B, and 7C, a suitable etching process is performed on the spacer 142 using the second mask pattern 160 as an etching mask. The area where the spacer 142 is exposed through the second mask pattern 160 is removed, and the spacer 142 that remains becomes a non-continuous structure. In correspondence with an opening of the second mask pattern 160, the area where the spacer 142 being removed includes the part spanning across the portion of the predetermined word line region 10W in the direction of the y-axis and reaching the portion of the pair of predetermined select gate regions 10S in the direction of the y-axis, and the other part spanning across the portion of the predetermined pick-up neck region 10P in the direction of the x-axis. In this way, the plurality of word lines 210 and the plurality of pick-up neck pairs 230 formed subsequently may be prevented from conducting with each other and causing short circuitry during operation. The present flash memory process would completely remove the connecting portion 10W-C of the predetermined word line region 10W, but the embodiments of the present disclosure preserve a partial pattern of the connecting portion 10W-C as the dummy structure 200, thereby improving the issues of etch loading effect. As shown in FIG. 7C, in comparison with FIG. 6C, the spacer 142 in the area being exposed through the second mask pattern 160 is removed.

Figures 8A, 8B, 8C:
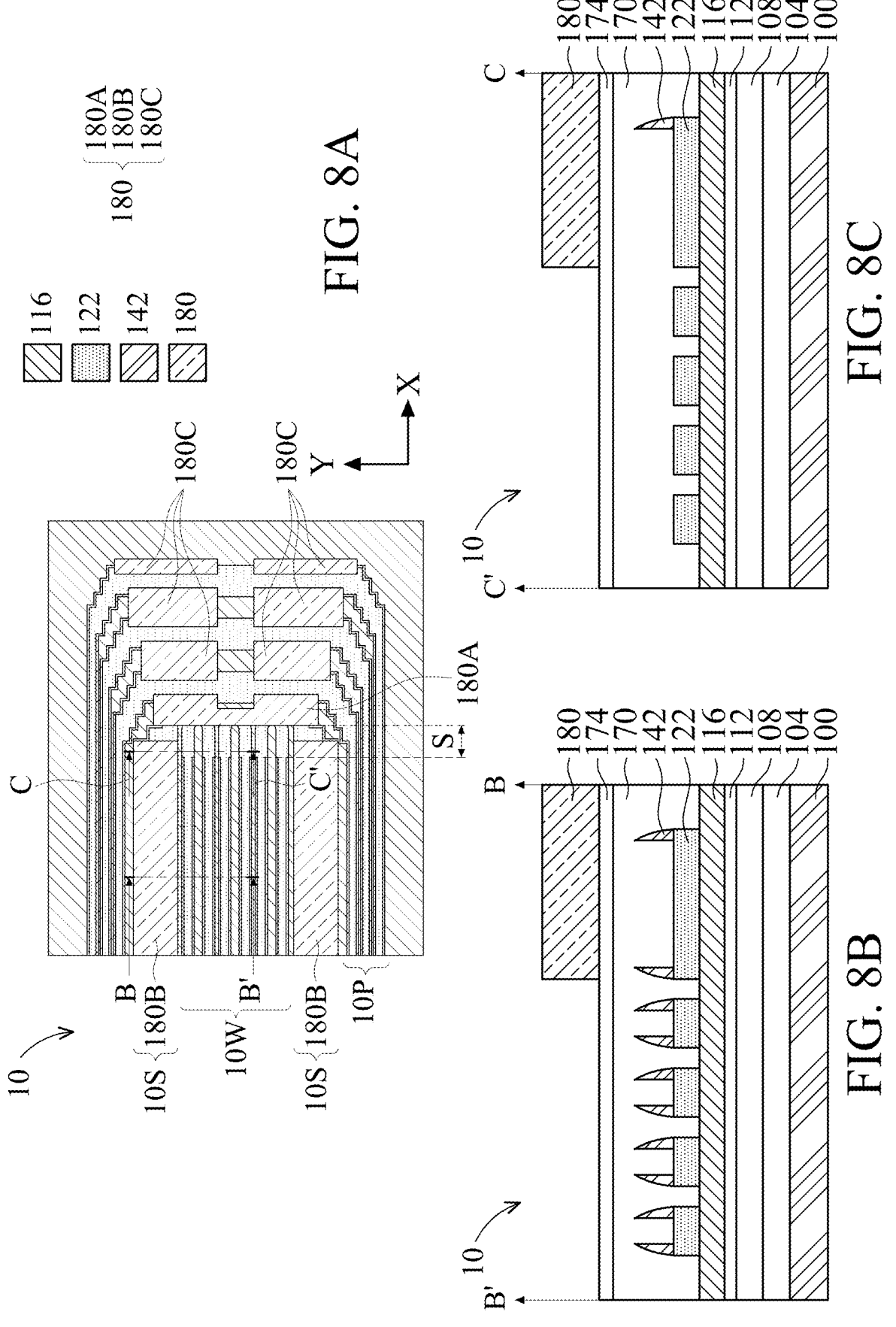
Figures 9A, 9B, 9C:
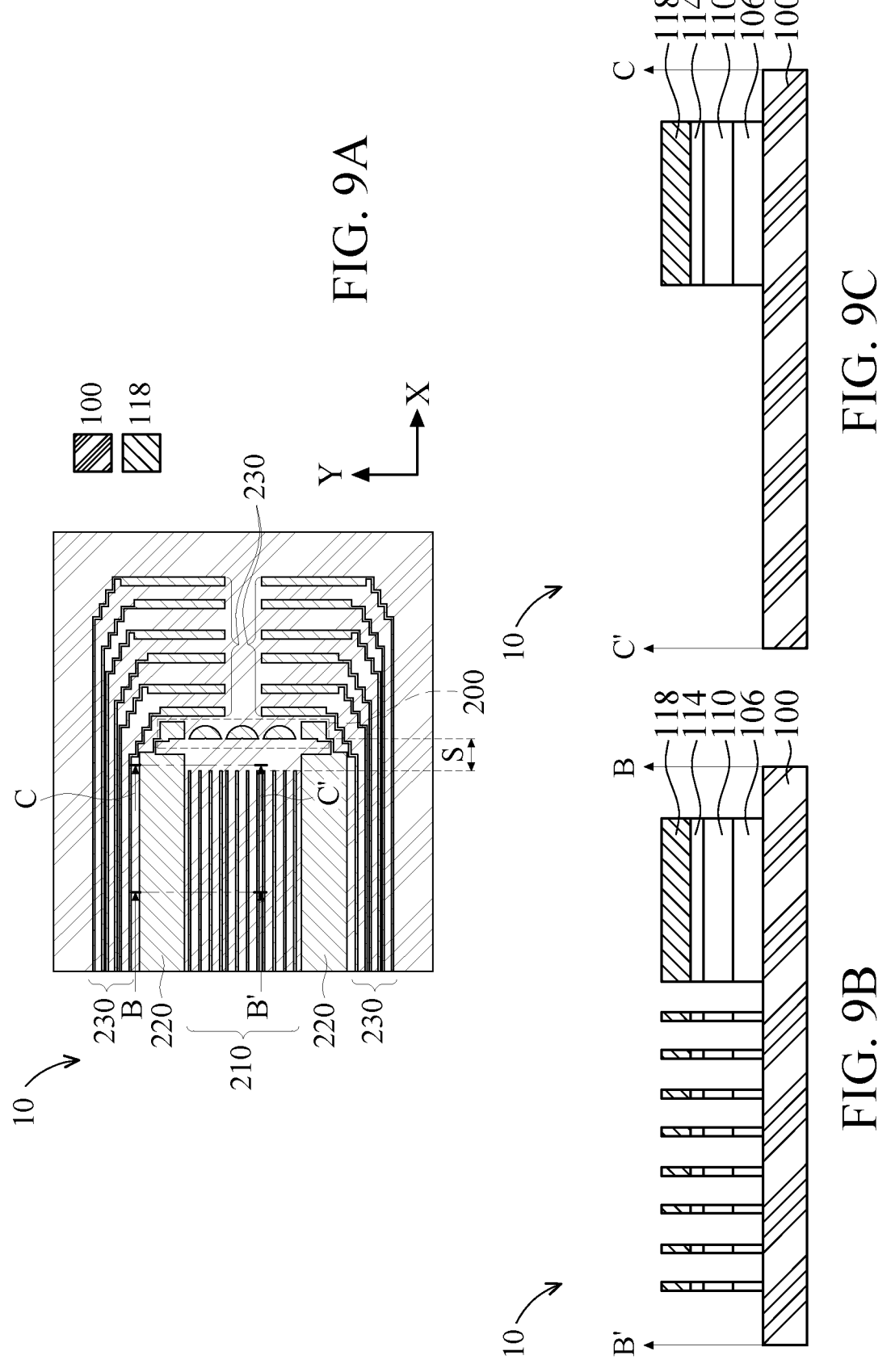

Please refer to FIGS. 8A, 8B, and 8C, in order to form the plurality of word lines 210, the pair of select gates 220, the plurality of pick-up neck pairs 230, and the dummy structure 200 specifically characterized in the present disclosure, another patterning process may be performed on the flash memory 10. This procedure is known as partially depletion (PD). As shown in FIG. 8A, a third mask pattern 180 may be formed on the flash memory 10. The third mask pattern 180 may include a first portion 180A, a second portion 180B, and a third portion 180C. The first portion 180A laterally (for example, in the direction of the x-axis) spans across from the connecting portion 10W-C of the predetermined word line region 10W and a portion of the pair of predetermined select gate regions 10S corresponding to the connecting portion 10W-C in the direction of the y-axis toward a portion of the predetermined pick-up neck region 10P, such portion includes a portion of the spacer 142. The first portion 180A of the third mask pattern 180 may be vertically (for example, in the direction of the y-axis) compartmentalized into two terminal sections and one middle section located between the two terminal sections. The two terminal sections of the first portion 180A spans across from the connecting portion 10W-C of the predetermined word line region 10W and the portion of the pair of predetermined select gate regions 10S corresponding to the connecting portion 10W-C in the direction of the y-axis toward the portion of the predetermined pick-up neck region 10P (including the portion of the spacer 142), while the middle section of the first portion 180A only covers the connecting portion 10W-C in the direction of the x-axis.

As shown in FIG. 8A, the unique shape of the first portion 180A of the third mask pattern 180 protects the connecting portion 10W-C in the direction of the y-axis and the portion of the pair of predetermined select gate regions 10S corresponding to the connecting portion 10W-C in the direction of the y-axis from being removed in subsequent processes, so these being protected may form the dummy structure 200. In the present method of forming flash memories, the first portion 180A of the third mask pattern 180 only has two separated terminal sections, without the middle section connecting the two terminal sections, while the two terminal sections only cover the portion of the predetermined pick-up neck region 10P, without spanning across toward the predetermined word line region 10W and the pair of predetermined select gate regions 10S in the direction of the x-axis, which is similar to the third portion 180C of the third mask pattern 180 (described in detail below). If the middle section and the two terminal sections of the first portion 180A all span across from the predetermined word line region 10W and the pair of predetermined select gate regions 10S toward the predetermined pick-up neck region 10P together, then a subsequent etching process cannot cut off the conductive layer 108 below the spacer 142 of the portion of the predetermined pick-up neck region 10P, resulting in the pick-up neck pair 230 closest to the plurality of word lines 210 to conduct with each other and to cause short circuitry. Therefore, in comparison with the two terminal sections, the middle section is shrunk inward in negative the direction of the x-axis.

According to some embodiments of the present disclosure, the dummy structure 200 may be formed by extending the predetermined word line region 10W and the pair of predetermined select gate regions 10S in the direction of the x-axis toward the predetermined pick-up neck region 10P, and extending the first portion 180A of the third mask pattern 180 in the direction of the x-axis to cover the connecting portion 10W-C of the predetermined word line region 10W and the portion of the pair of predetermined select gate regions 10S corresponding to the connecting portion 10W-C in the direction of the y-axis. The dummy structure 200 may occupy the isolated circuit region, in order to decrease the etch loading effect on the end points of the plurality of word lines 210, leading to less occurrences of bowling or fracture. The spacer 142 of the remaining portion of the predetermined word line region 10W and the first portion 180A of the third mask pattern 180 have the spacing S in the direction of the x-axis. In some embodiments of the present disclosure, the spacing S may be between about 10 nm and 150 nm. One boundary of the spacing S close to the spacer 142 of the remaining portion of the predetermined word line region 10W is defined by the second mask pattern 160, while another boundary of the spacing S close to the third mask pattern 180 in the direction of the x-axis is defined by the first portion 180A of the third mask pattern 180. Since the dimension of the spacing S in the direction of the x-axis is sequentially defined by the second mask pattern 160 and the third mask pattern 180, such dimension can be smaller than the minimum spacing obtained using a single patterning process from a single equipment.

Still referring to FIGS. 8A, 8B, and 8C, the second portion 180B and the third portion 180C of the third mask pattern 180 may cover a portion of the pair of predetermined select gate regions 10S and a portion of the predetermined pick-up neck region 10P, respectively. The formation of the third mask pattern 180 includes coating a second photoresist layer 170 on the surface of the flash memory 10. The second photoresist layer 170 completely covers the second dielectric layer 116, the patterned second polymer layer 122, and the spacer 142, and the second photoresist layer 170 has a planarized top surface. A third anti-reflective coating layer 174 may be formed on the second photoresist layer 170, materials, forming method, and function of the third anti-reflective coating layer 174 may be similar with the first anti-reflective coating layer 128 or the second anti-reflective coating layer 154. The third mask pattern 180 may be formed on the third anti-reflective coating layer 174. The first mask pattern 134 and the third mask pattern 180 are both positive-type photoresist, while the second mask pattern 160 is negative-type photoresist.

Please refer to FIGS. 9A, 9B, and 9C, a suitable etching process may be performed after forming the third mask pattern 180. In an area not covered by the third mask pattern 180, the layers below the patterned second polymer layer 122 may be etched using the spacer 142 as etching mask, and the patterned second polymer layer 122 is removed, until the surface of the substrate 100 is exposed. In an area covered by the third mask pattern 180, because of being protected, only the spacer 142 is removed, and the underlying layers may be etched subsequently using the patterned second polymer layer 122 as etching mask, until the surface of the substrate 100 is exposed. The etching process implements the spacer 142 and the patterned second polymer layer 122 as etching masks to etch (or indirectly pattern) the second dielectric layer 116, which is formed into a patterned second dielectric layer 118. As shown in FIG. 9A, after etching away the area beyond the etching masks (the spacer 142 or the patterned second polymer layer 122), the process of the flash memory 10 is completed. The flash memory 10, whose top portion is constructed with the patterned second dielectric layer 118, includes the plurality of word lines 210 formed in the predetermined word line region 10W, the pair of select gates 220 formed in the pair of predetermined select gate regions 10S, the plurality of pick-up neck pairs 230 formed in the predetermined pick-up neck region 10P, and the dummy structure 200 between the plurality of word lines 210 and the plurality of pick-up neck pairs 230 in the direction of the x-axis.

As shown in FIG. 9A, the connecting portion 10W-C including multiple U-shaped structures may form multiple bullet shapes after the etching process. Since every U-shaped structure of the present disclosure connects to two adjacent strip structures in the predetermined word line region 10W, and the plurality of word lines 210 are defined by opposing sidewalls of every strip structure, hence every bullet shape finally formed corresponds to four of the word lines 210 in the direction of the x-axis, but the present disclosure is not limited thereto. For example, the connecting portion 10W-C of multiple M-shape structures may be used to connect to three adjacent strip structures in the predetermined word line region 10W, and every bullet shape finally formed may become wider in the direction of the y-axis, which corresponds to six of the word lines 210.

Still referring to FIG. 9A, two sides of the dummy structure 200 in the direction of the y-axis contain two terminal portions formed in the predetermined pair of select gate regions 10S, both terminal portions are connected to the pair of select gates 220. Because the two terminal portions of the dummy structure 200 also occupy the isolated circuit region, a linear structure at a turning point of the pick-up neck pair 230 closest to the original isolated circuit region is also protected, in order to decrease the etch loading effect, leading to less occurrences of bowling or fracture. The plurality of word lines 210 and the dummy structure 200 have the spacing S in the direction of the x-axis, which may be between about 10 nm and 150 nm. Because the gate insulating cut is performed in the previous process, so the plurality of word lines 210 and the plurality of pick-up neck pairs 230 become the multiple independent and normally operated structures, which prevent short circuitry caused by conducting. Placing the dummy structure 200 significantly reduces the isolated circuit region, decreases etch loading effect of the etching process on the end points the plurality of word lines 210 and the linear structure at the turning point of the pick-up neck pair 230, and also lowers the occurrences of bowling or fracture.

As shown in FIGS. 9B and 9C, besides etching the second dielectric layer 116 that is formed into the patterned second dielectric layer 118, the etching process also etches the first dielectric layer 112, the conductive layer 108, and the first polymer layer 104, which are formed into a patterned first dielectric layer 114, a patterned conductive layer 110, and a patterned first polymer layer 106, respectively. FIG. 9B includes one of the pair of select gates 220 and multiple word lines 210. Because of crossing the shrunk isolated circuit region, FIG. 9C only includes one of the pair of select gates 220.

Figures 10, 11, 12, 13:
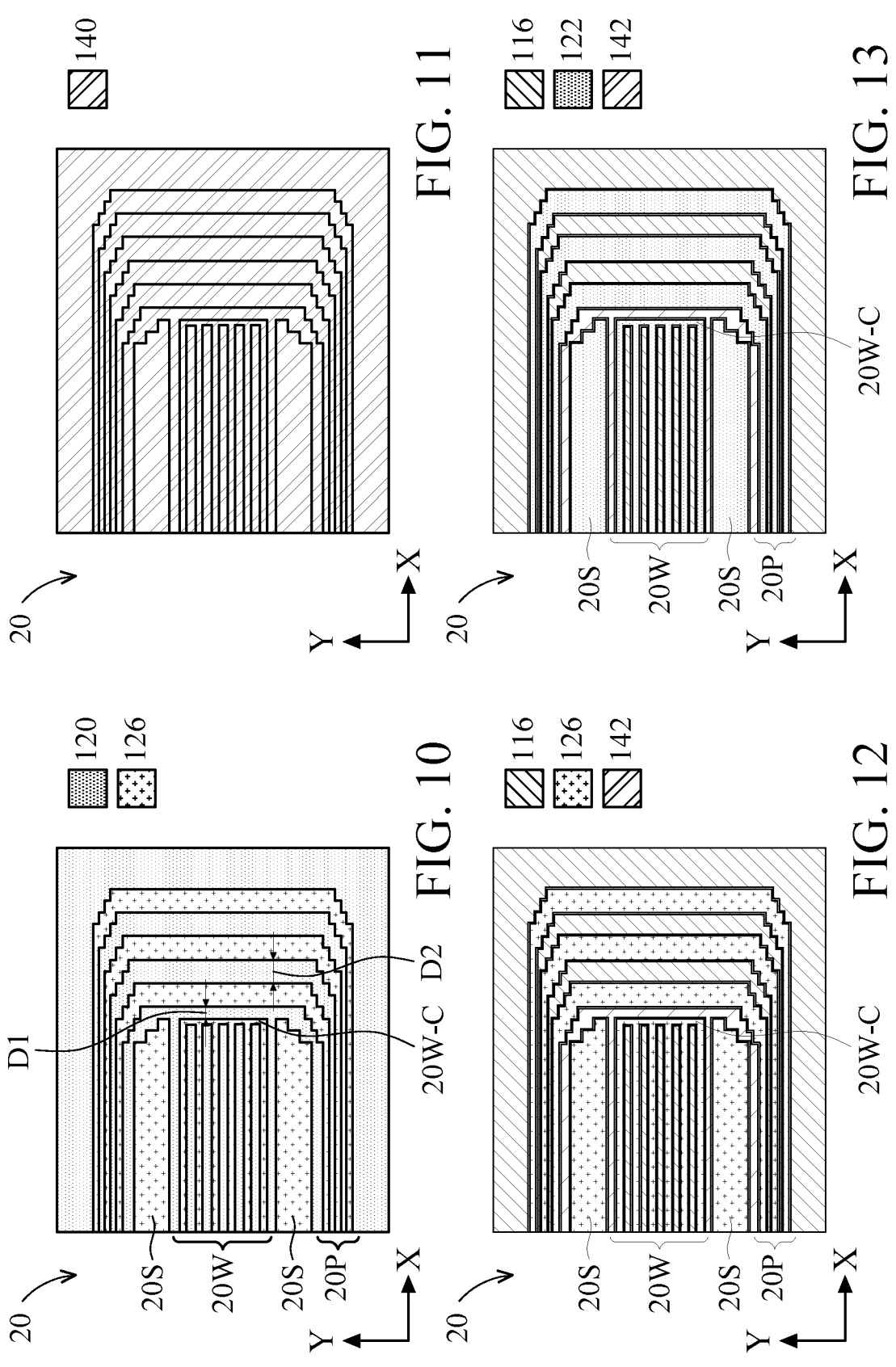

FIGS. 10-17 illustrate top views of various intermediate stages of forming a flash memory 20, according to other embodiments of the present disclosure. FIG. 10 is the procedure of forming the patterned third dielectric layer 126 on the second polymer layer 120, in correspondence to FIG. 2A, where the patterned third dielectric layer 126 includes a predetermined word line region 20W, a pair of predetermined select gate regions 20S, and a predetermined pick-up neck region 20P (which correspond to the predetermined word line region 10W, the pair of predetermined select gate regions 10S, and the predetermined pick-up neck region 10P, respectively). In comparison with FIG. 2A, the difference between the flash memory 10 and the flash memory 20 is that a connecting portion 20W-C of the predetermined word line region 20W includes a single rectangular structure that connects to all strip structures in the predetermined word line region 20W. The procedures of FIGS. 11-16 may correspond to FIGS. 3A-8A, respectively.

Figures 14, 15, 16, 17:
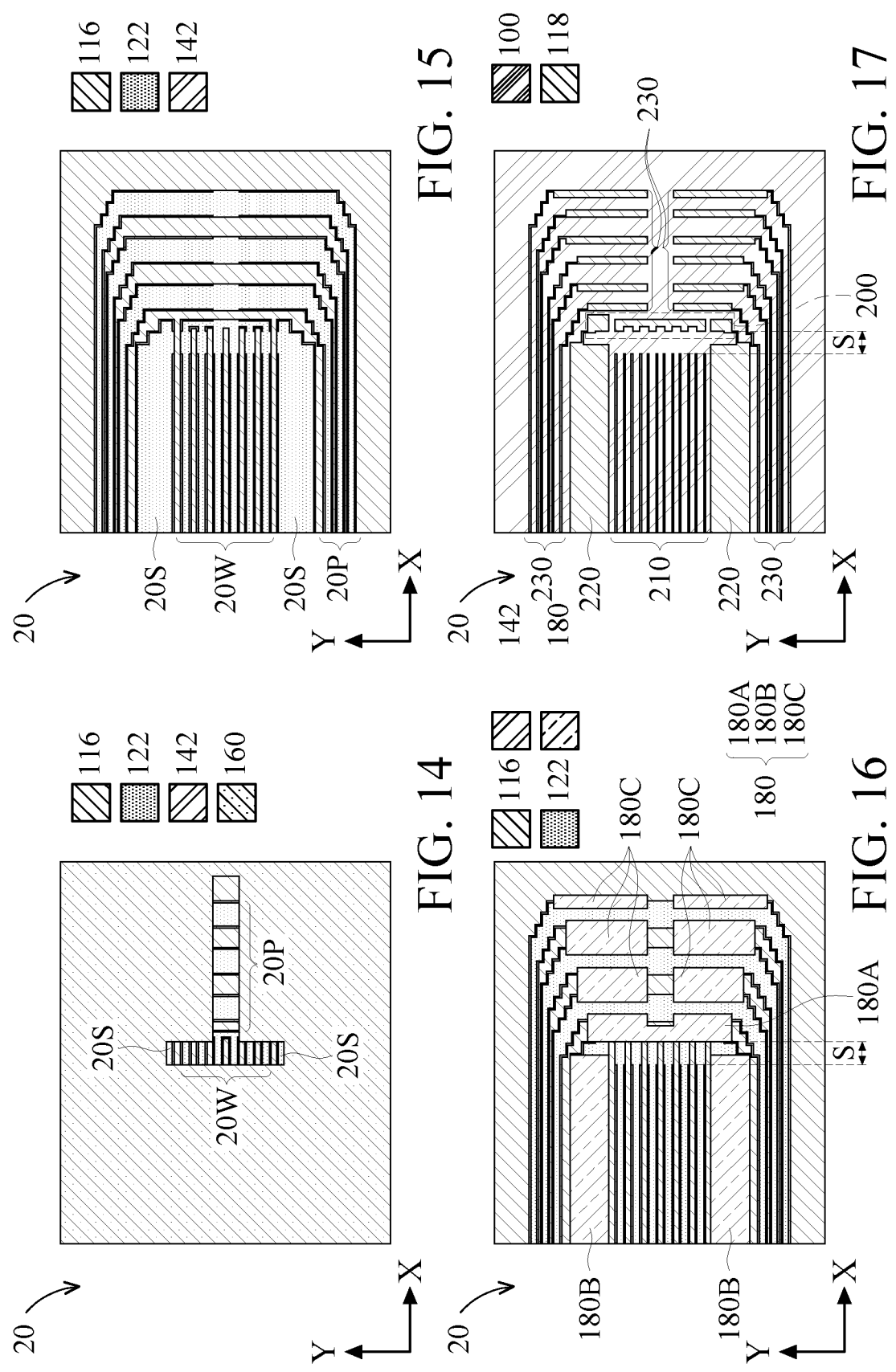

Please refer to FIG. 17, the dummy structure 200 of the flash memory 20 includes a single comb shape. In comparison with FIG. 9A, due to different designs between the connecting portion 10W-C and the connecting portion 20W-C, the final dummy structures 200 of the flash memory 10 and the flash memory 20 have different shapes.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method forming a semiconductor device, the method comprising:
   providing a substrate, and forming a conductive layer on the substrate;

forming a patterned dielectric layer on the conductive layer, the patterned dielectric layer comprises:

a predetermined word line region extending in a first direction, wherein the predetermined word line region has a connecting portion and a linear portion;

a pair of predetermined select gate regions, wherein the predetermined word line region is disposed between the pair of predetermined select gate regions in a second direction perpendicular to the first direction;

a predetermined pick-up neck region surrounding the pair of predetermined select gate regions, wherein the predetermined word line region and the predetermined pick-up neck region are separated by a first distance in the first direction, and neighboring segments within the predetermined pick-up neck region are separated by a second distance in the first direction, wherein the first distance is smaller than or equal to the second distance;

forming a spacer on sidewalls of the patterned dielectric layer, and removing the patterned dielectric layer after forming the spacer;

cutting off the spacer in a section of the linear portion to separate the spacer in the connecting portion of the predetermined word line region from the spacer in a remaining linear portion of the predetermined word line region;

forming a mask pattern on the spacer, wherein the mask pattern comprises a first portion, the first portion laterally spans across the spacer in the connecting portion and the spacer in a portion of the predetermined pick-up neck region, wherein the spacer of the remaining portion of the predetermined word line region and the first portion of the mask pattern are laterally separated by a spacing; and performing an etching process on the conductive layer to form a dummy structure, a plurality of word lines, a pair of select gates, and a plurality of pick-up neck pairs using the mask pattern and the spacer as etching masks, wherein the dummy structure is laterally located between the plurality of word lines and the plurality of pick-up neck pairs.

2. The method of claim 1, further comprising forming a polymer layer on the conductive layer before forming the patterned dielectric layer on the substrate.

3. The method of claim 2, further comprising forming one or more dielectric layers between the conductive layer and the polymer layer.

4. The method of claim 2, wherein forming the spacer comprises conformally depositing a spacer material layer and etching back the spacer material layer.

5. The method of claim 4, wherein etching back the spacer material layer further comprises etching the polymer layer to form a patterned polymer layer.

6. The method of claim 5, further comprising removing the patterned polymer layer after the etching process.

7. The method of claim 1, wherein cutting off the spacer further comprises cutting off a portion of the spacer in the predetermined pick-up neck region.

8. The method of claim 1, wherein the connecting portion is multiple U-shaped structures or a single rectangular structure.

9. The method of claim 1, wherein a middle section of the first portion of the mask pattern only covers the connecting portion, but not the predetermined pick-up neck region.

10. The method of claim 1, wherein the mask pattern further comprises a second portion covering the spacer in the pair of predetermined select gate regions.

11. The method of claim 1, wherein the dummy structure is formed by the conductive layer below the first portion of the mask pattern.

12. The method of claim 1, wherein the spacing is between 10 nm and 150 nm.

* * * * *